(12) United States Patent
Pei et al.

(10) Patent No.: US 6,217,362 B1
(45) Date of Patent: Apr. 17, 2001

(54) ELECTRICAL CONNECTOR HAVING IMPROVED CONTACT ELEMENTS

(75) Inventors: Wen-Chun Pei, Taipei; Yao-Chi Huang, Yung-Ho, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/321,706

(22) Filed: May 28, 1999

(30) Foreign Application Priority Data

Dec. 8, 1998 (TW) ................................. 87220446

(51) Int. Cl.[7] ............................. H01R 4/50; H01R 13/625
(52) U.S. Cl. ................................................. 439/342
(58) Field of Search ................................. 439/342, 259, 439/266

(56) References Cited

U.S. PATENT DOCUMENTS

| 5,044,973 | * | 9/1991 | Noda et al. | 439/296 |
| 5,492,488 | * | 2/1996 | Hsu | 439/342 |
| 5,622,514 | * | 4/1997 | Crompton, III et al. | 439/342 |
| 5,855,489 | * | 1/1999 | Walker | 439/342 |

* cited by examiner

Primary Examiner—Brian Sircus
Assistant Examiner—Brian S. Webb
(74) Attorney, Agent, or Firm—Wei Te Chung (57) ABSTRACT

An electrical connector includes an insulative base (8) defining a plurality of contact receiving bores (81) for each receiving a contact element (9) therein. A cover plate (5) is attached to the base to define a space therebetween for movably receiving a slide plate (7). The slide plate defines a plurality of slots (72) corresponding to the contact receiving bores of the base and each slot retains a conductive member (70) therein. The cover plate defines holes (51) therein corresponding to the slots and adapted to guide pins (4) of a chip module into the slots. The slide plate is moveable between a released position and an engaged position where the conductive member engages with both the pin and the contact element to establish electrical connection therebetween. Each contact element includes a soldering section (92) extending beyond the base and adapted to be soldered to a circuit board (3), and an engaging section (93) extending into the corresponding slot for being engaged by the conductive member. A retention section (91) fixed in the base is spaced from and connected to the soldering section by a connection section (910) thereby allowing a reduction of thickness of the connector without sacrificing the mechanical strength thereof. The connection section is resiliently deformable to accommodate a relative movement between the retention section and the soldering section caused by a difference in thermal expansion between the connector and the circuit board.

15 Claims, 6 Drawing Sheets

ELECTRICAL CONNECTOR HAVING IMPROVED CONTACT ELEMENTS

BACKGROUND OF THE INVENTION

1. Field of the Invention

The present invention generally relates to an electrical connector, and in particular to a zero insertion force (ZIF) ball grid array (BGA) connector having firmly secured contact elements for effectively forming an electrical connection with pins of a chip module.

2. The Prior Art

Chip modules have been improved significantly. The amount and speed of data transferred by the chip modules has increased rapidly. Thus, a corresponding modification of a connector connecting the chip module to a circuit board is required. Corresponding examples are disclosed in Taiwan Patent Application Nos. 83207257, 83208396, 83212080 and 83212081.

Figure 1A:
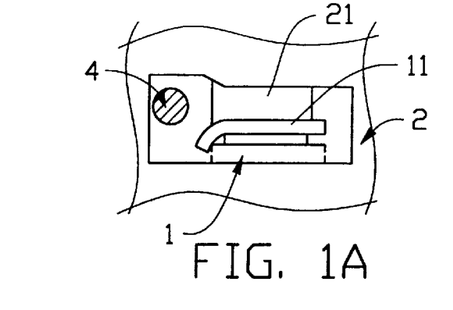
FIG. 1A is a plan view of a portion of a conventional connector when a pin of a chip module does not contact a contact element of the connector.
Figure 1B:
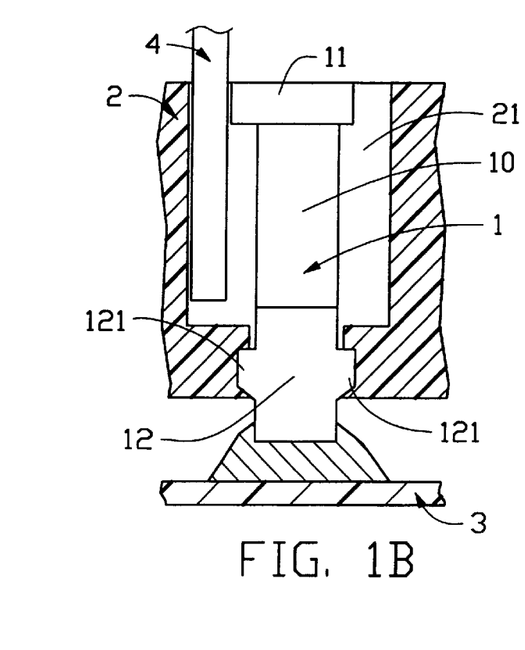
FIG. 1B is a cross-sectional view of FIG. 1A.
Figure 1C:
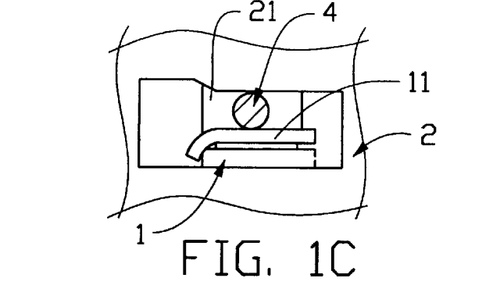
FIG. 1C is a plan view of a portion of the conventional connector when the pin is brought into contact with the contact element of the connector.
Figure 1D:
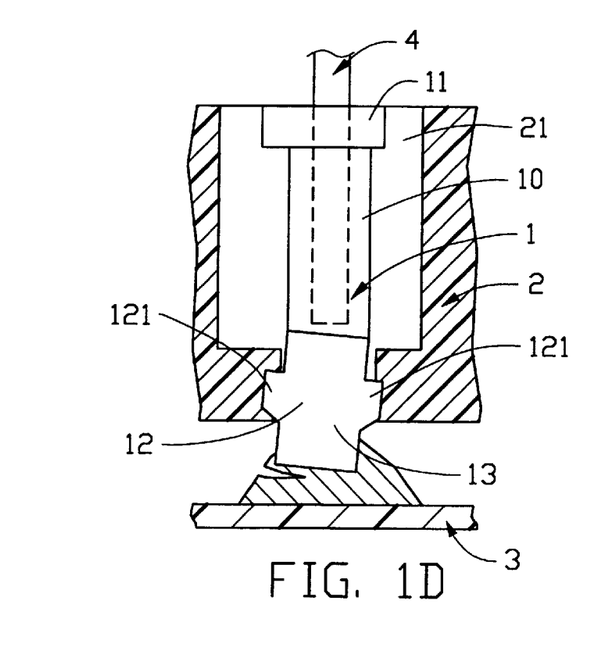
FIG. 1D is a cross-sectional view of FIG. 1C.

FIGS. 1A, 1B, 1C and 1D show a conventional connector wherein FIGS. 1A and 1C are top views of a portion of the connector while FIGS. 1B and 1D are corresponding cross-sectional views. The conventional connector defines a number of contact receiving holes 21 in an insulative body 2 for retaining contact elements 1 therein. Each contact element 1 has an elongate body 10 comprising an engaging section 11 at one end and a retention section 12 at an opposite end. A soldering section 13 further extends from the retention section 12 and protrudes beyond the body 2 for being soldered to a circuit board 3 by solder 31. The retention section 12 comprises barbs 121 for engaging with an inside surface of the contact receiving hole 21 to secure the contact element 1 therein.

Pins 4 of a chip module are inserted into the contact receiving holes 21 of the body 2 but are initially separated from the contact elements 1. The chip module is then moved relative to the body 2 to bring the pins 4 into contact with contact elements 1 as shown in FIGS. 1C and 1D whereby the pins 4 are electrically connected to the contact elements 1.

A disadvantage associated with the conventional connector is that during the movement of the chip module, a great force is applied to the contact element 1 by the pin 4 which in turn induces a large moment at the retention section 12. The retention section 12 may thus be moved and separated from the body 2 as shown in FIG. 1D, causing damage to the solder 31 connection.

Furthermore, since the retention section 12 and the soldering section 13 are immediately adjacent to each other, a strain may be induced on the solder 31 connection due to a difference in thermal expansion of the insulative body 2 and the circuit board 3. The strain may sometimes cause breakage of the solder 31 connection. In addition, the retention section 12 and the soldering section 13 are vertically stacked on each other thereby hindering a reduction of the thickness of the insulative body 2 while maintaining the same mechanical strength when securing the retention section 12 in the contact receiving hole 21.

It is thus desirable to have an electrical connector that overcomes the problems mentioned above.

SUMMARY OF THE INVENTION

Accordingly, an object of the present invention is to provide an electrical connector comprising contact elements firmly secured in contact receiving bores defined in an insulative body.

Another object of the present invention is to provide an electrical connector comprising contact elements each having a resiliently deformable section for accommodating strain caused by different thermal expansions between the insulative body and a circuit board to which the connector is soldered.

A further object of the present invention is to provide an electrical connector comprising a number of contact elements each having a retention section offset from a main section thereof thereby allowing a reduction of the thickness of the connector while maintaining the same mechanical strength to secure the contact element in the connector.

To achieve the above objects, an electrical connector in accordance with the present invention comprises an insulative base defining a plurality of contact receiving bores for each receiving a contact element therein. A cover plate is attached to the base to define a space therebetween for movably receiving a slide plate. The slide plate defines a plurality of slots corresponding to the contact receiving bores of the base and each slot retains a conductive member therein. The cover plate defines holes therein corresponding to the slots and adapted to guide pins of a chip module into the slots. The slide plate is movable between a released position and an engaged position where the conductive member engages with both the pin and the contact element to establish electrical connection therebetween. Each contact element includes a soldering section extending beyond the base and adapted to be soldered to a circuit board, and an engaging section extending into the corresponding slot for being engaged by the conductive member. A retention section fixed in the base is spaced from and connected to the soldering section by a connection section thereby allowing a reduction of thickness of the connector without sacrificing the mechanical strength thereof. The connection section is resiliently deformable to accommodate a relative movement between the retention section and the soldering section caused by a difference in thermal expansion between the connector and the circuit board.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 2:
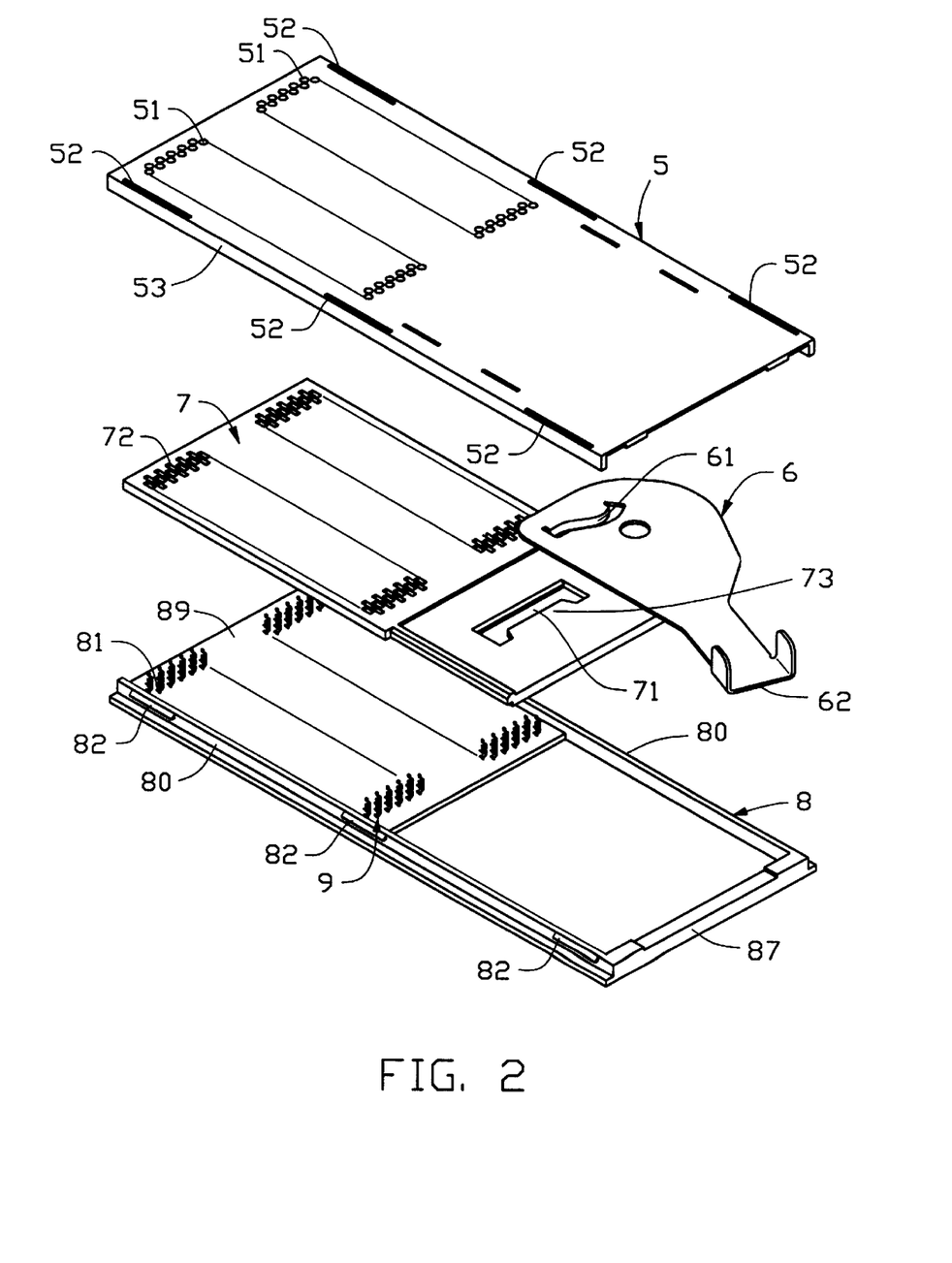
FIG. 2 is an exploded view of an electrical connector constructed in accordance with the present invention.
Figure 3:
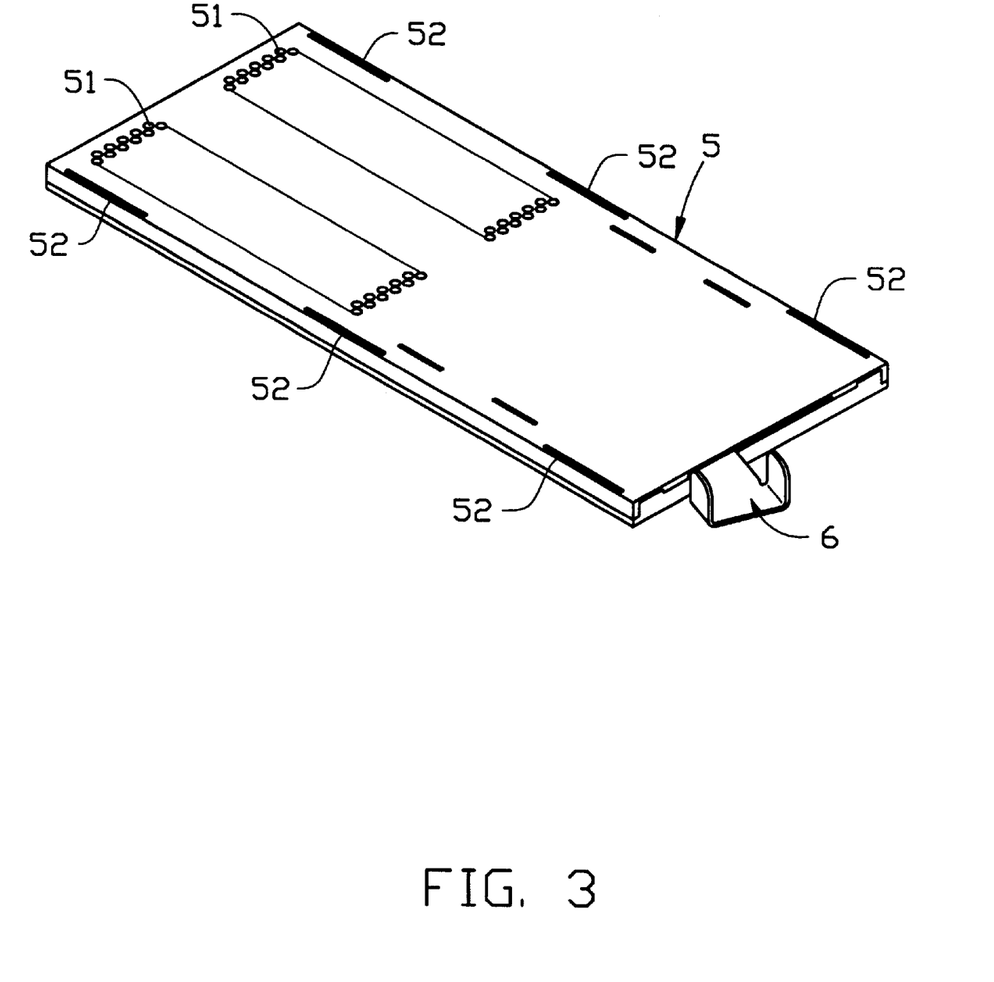
FIG. 3 is an assembled view of FIG. 2.
Figure 4A:
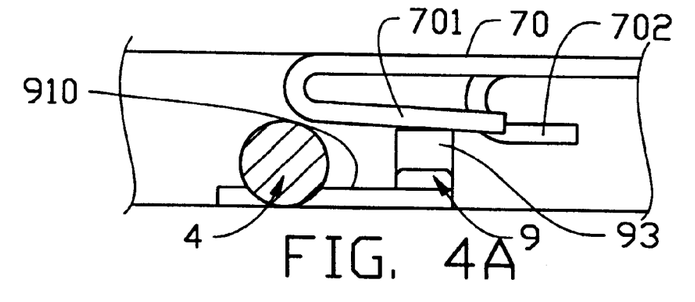
FIG. 4A is a plan view of a portion of the connector of the present invention with a cover plate removed when a conductive member retained in a side plate does not engage with a pin of an external electronic device and a contact element retained in a base of the connector.

Referring to the drawings and in particular to FIGS. 2 and 3, a zero insertion force (ZIF) ball grid array (BGA) connector in accordance with the present invention comprises a base 8 having a bottom wall 89 defining contact receiving bores 81 in a top face 86 thereof for receiving contact elements 9, and two opposite side walls 80 extending from the bottom wall 89 defining a space therebetween (not labeled) for slidably receiving a slide plate 7 therein. The slide plate 7 is guided by the side walls 80 to move between a released position (FIGS. 4A and 4B) and an engaged position (FIGS. 5A and 5B). A cover plate 5 is attached to the base 8 to enclose the slide plate 7. The base 8 forms three barbs 82 on each of the side walls 80 thereof. The cover plate 5 forms two elongate flaps 53 respectively extending downwardly from two lateral sides thereof. Each flap 53 extends the entire length of its respective lateral side of the cover plate 5. The cover plate 5 defines three openings 52 in a top face (not labeled) along each lateral side thereof and adjacent an inner surface (not labeled) of the respective flap 53. The cover plate 5 and the base 8 are assembled together by engaging the barbs 82 with the flaps 53 at a position just below the openings 52.

The slide plate 7 defines a number of slots 72 corresponding to the contact receiving bores 81 of the base 8 for partially receiving the contact elements 9 therein. The slots 72 are dimensioned to not interfere with the contact elements 9 during movement of the slide plate 7 between the engaged position and the released position. The cover plate 5 defines a number of holes 51 therein corresponding to the slots 72 of the slide plate 7 for entry of pins 4 (FIGS. 4A, 4B, 5A and 5B) of an external electronic device, such as a central processing unit chip (not shown), into the slots 72.

A driving plate 6 is pivotally attached to and interposed between the bottom wall 89 of the base 8 and the cover plate 5 with a manual operating section 62 extending beyond an edge 87 of the base 8 for exhibiting manual access to rotate the driving plate 6 between a first angular position and a second angular position. The driving plate 6 has a cam portion 61 forming a camming contour engaged by a follower section 73 formed on the slide plate 7 whereby rotating the driving plate 6 between the first angular position and the second angular position causes the slide plate 7 to move between the engaged position and the release position.

In the embodiment illustrated, the cam portion 61 is formed by a curved rib which is movably received in an opening 71 defined in the slide plate 7. The opening 71 has an inward projection contacting the curved rib of the cam portion 61 to serve as the follower section 73 of the slide plate 7.

Figure 4B:
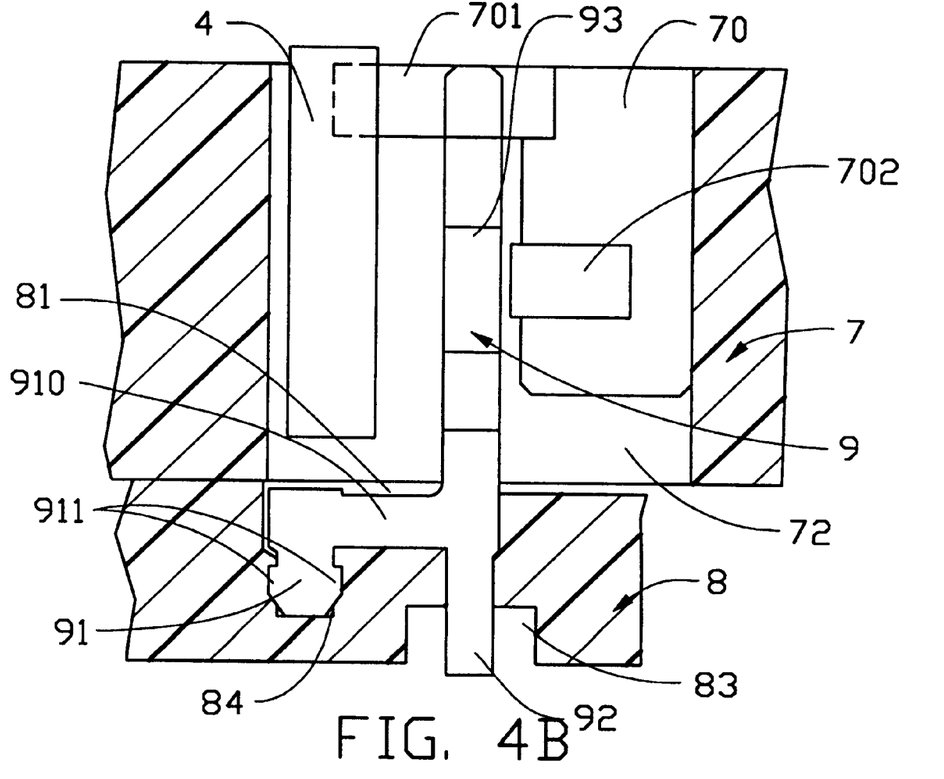
FIG. 4B is a cross-sectional view of FIG. 4A.
Figure 5A:
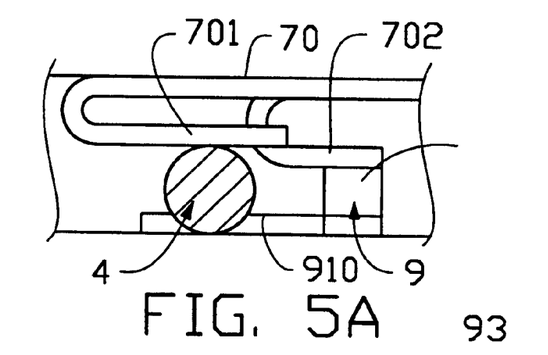
FIG. 5A is a plan view of a portion of the connector of the present invention with the cover plate removed when the conductive member retained in the slide plate is brought into engagement with a pin of the external electronic device and the contact element retained in the base of the connector.
Figure 5B:
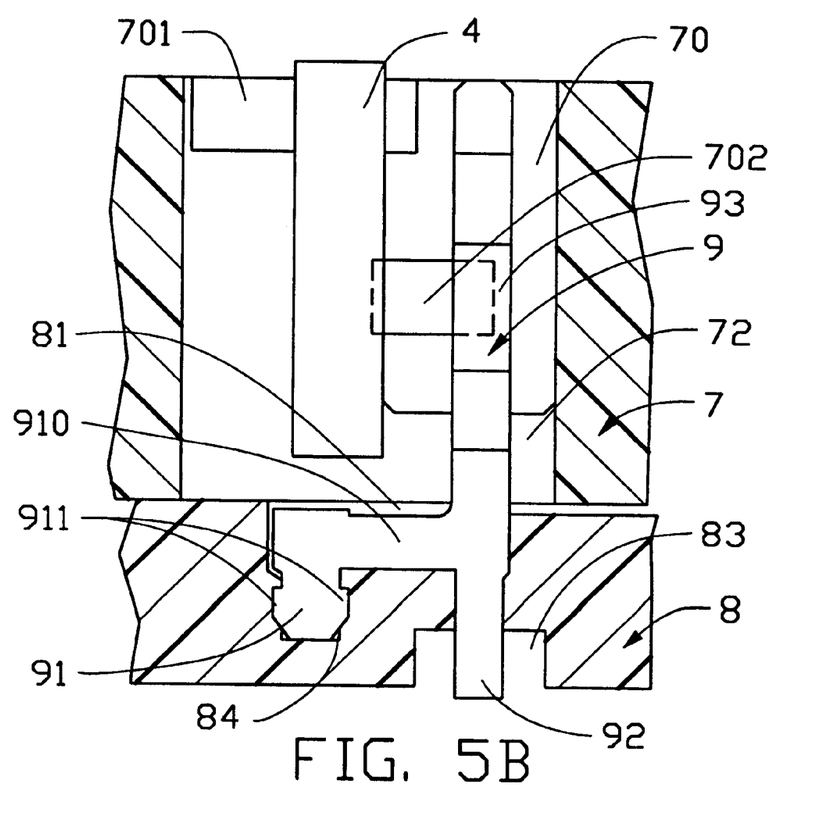
FIG. 5B is a cross-sectional view of FIG. 5A.

Referring to FIGS. 4B and 5B, each contact element 9 comprises a main (not labeled) constituting a soldering section 92 extending beyond the bottom wall 89 of the base 8 to be connected to a circuit board 3 (FIGS. 6A and 6B) and an engaging section 93 extending into the corresponding slot 72 of the slide plate 7. The contact element 9 further comprises an offset retention section 91 spaced from and substantially parallel to the soldering section 92 and connected thereto by a connection section 910. The retention section 91 is received and retained in a cavity 84 defined in the bottom wall 89 of the base 8 and in communication with the contact receiving bore 81 thereby securing the contact element 9 in the contact receiving bore 81. The retention section 91 has barbs 911 engaging with inside surfaces (not labeled) of the cavity 84 for retaining the retention section 91 in the cavity 84. It should be noted that contrary to the prior art, the soldering section 92 of the present invention is free to move with respect to the base 8.

A conductive member 70 is retained in each of the slots 72 of the slide plate 7. The conductive member 70 has a first resilient arm 701 and a second resilient arm 702, preferably in the form of a "U". The resilient arms 701, 702 are dimensioned to respectively contact the engaging section 93 of the corresponding contact element 9 and the pin 4 of the external electronic device when the slide plate 7 is moved from the released position to the engaged position. Electrical connection is thus established between the pin 4 of the external electronic device and the contact element 9 of the connector.

In the embodiment illustrated, the retention section 91 of the contact element 9 is arranged at the side of the soldering section 92 that is opposite the second resilient arm 702 of the conductive member 7 thereby providing a more sound support of the contact element 9 against the force acting thereupon by the contact with the second resilient arm 702 when the slide plate 7 is moved toward the engaged position.

Figure 6A:
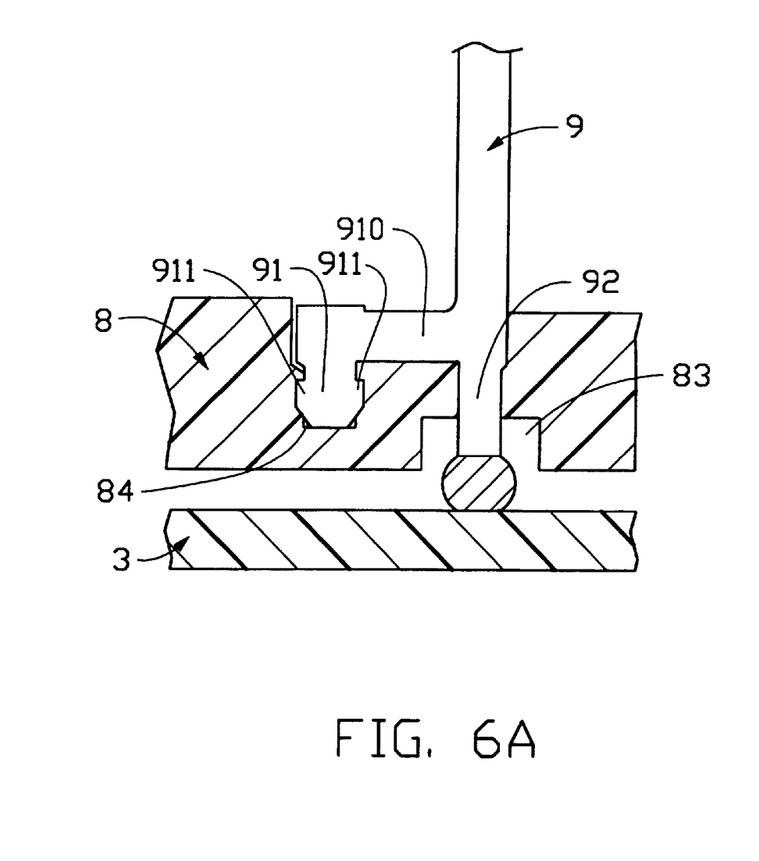
FIG. 6A is a cross-sectional view of the base of the connector and a circuit board to which the contact element is to be soldered.
Figure 6B:
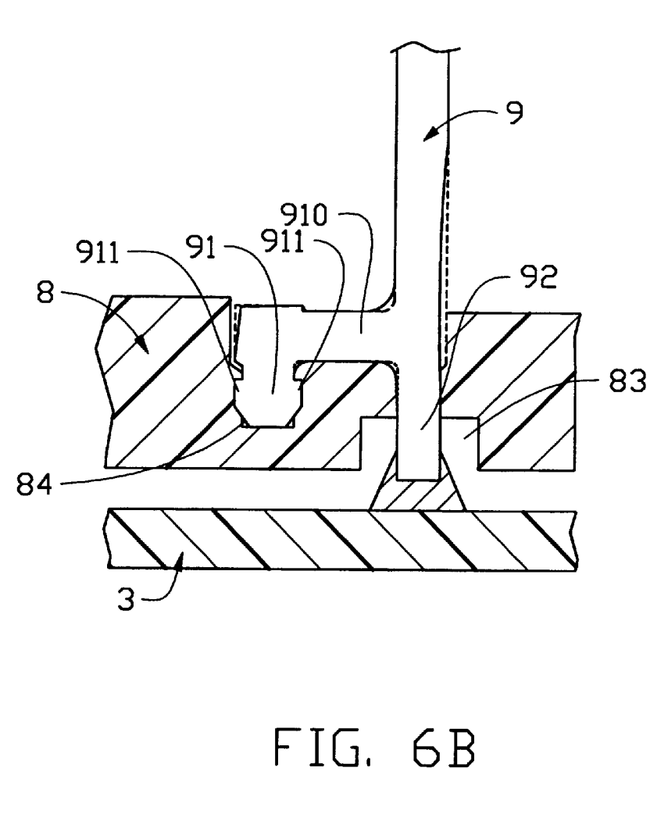
FIG. 6B is a cross-sectional view similar to FIG. 6A but showing the contact element soldered to the circuit board.

As shown in FIG. 6A, the soldering section 92 of each contact element 9 has a free end projecting beyond a bottom face 88 of the bottom wall 89 of the base 8 to which a solder ball 31 is attached for connecting the contact element 9 to the circuit board 3. The solder ball 31 is molten and connects the contact element 9 to the circuit board 3 as shown in FIG. 6B. Due to the difference in thermal expansion coefficients between the base 8 of the connector and the circuit board 3, a relative movement between the retention section 91 and the soldering section 92 caused by different expansions occurs during the soldering process as indicated by phantom lines shown in FIG. 6B. The connection section 910 between the retention section 91 and the soldering section 92 is resiliently deformable thereby accommodating the relative movement occurring between the retention section 91 and the soldering section 92. Thus, the solder ball 31 connection is protected from being acted upon by excessive internal stress and the corresponding strain. A stable solder ball 31 connection is thus maintained.

Preferably, a recess 83 is defined in the bottom face 88 of the base 8 surrounding the free end of the soldering section 92 of the contact element 9 for accommodating molten soldering material from the solder ball 31.

In addition to allowing the soldering section 92 to freely move with respect to the base 8, arranging the retention section 91 parallel to the soldering section 92 rather than vertically stacking provides an additional advantage of reducing a thickness of the bottom wall 89 of the base 8 without sacrificing the mechanical strength thereof for securing the contact element 9 in the contact receiving bore 81 of the base 8.

Although the present invention has been described with reference to the preferred embodiment, it is apparent to those skilled in the art that a variety of modifications and changes may be made without departing from the scope of the present invention which is intended to be defined by the appended claims.

What is claimed is:

1. An electrical connector adapted to be mounted on a circuit board for electrically connecting an electronic device to the circuit board, comprising:

a plurality of contact elements;

an insulative base defining a plurality of contact receiving bores for each receiving a corresponding contact element therein;

a slide plate movably supported on the base, the slide plate defining a plurality of slots therein corresponding to the contact receiving bores of the base, each slot being adapted to receive a pin of the electronic device;

driving means coupled to the slide plate for moving the slide plate with respect to the base between a released position and an engaged position for establishing electrical connection between the pin and the contact element;

each contact element comprising a soldering section extending beyond a bottom face of the base to be connected to the circuit board, an engaging section extending into the corresponding slot of the slide plate to be electrically engaged by the pin, and an offset retention section spaced from and connected to the soldering section by a connection section; and the slide plate comprising a conductive member retained in each of the slots thereof, the conductive member being configured to contact both the pin of the electrical device and the contact element of the base when the slide plate is at the engaged position for establishing electrical connection between the pin and the contact element.

2. The electrical connector as claimed in claim 1, wherein the connection section of the contact element is resiliently deformable for accommodating a relative movement between the soldering section and the retention section.

3. The electrical connector as claimed in claim 1, wherein the retention section is received in a cavity defined in the base, the retention section having barbs engaging with an inside surface of the cavity for securing the retention section in the cavity thereby retaining the contact element in the contact receiving bore.

4. The electrical connector as claimed in claim 1, wherein the conductive member of the slide plate comprises two resilient arms respectively engaging with the pin and the contact element when the slide plate is at the engaged position.

5. The electrical connector as claimed in claim 1, wherein the driving means comprises a plate pivotally attached to the base and rotatable between a first angular position and a second angular position, the plate forming a camming contour engaged by a follower section formed on the slide plate whereby when the plate is rotated between the first and second angular positions, the slide plate is moved between the engaged position and the released position.

6. The electrical connector as claimed in claim 5, wherein the camming contour is defined by a curved rib formed on the plate of the driving means, and wherein the slide plate defines an opening for movably receiving the curved rib therein, an inward projection being formed in the opening for engaging with the curved rib to serve as the follower section.

7. The electrical connector as claimed in claim 5, wherein the plate of the driving means comprises a manual operating section extending beyond the base and adapted to be manually operated to move the slide plate between the released position and the engaged position.

8. The electrical connector as claimed in claim 1, wherein the base comprises two opposite side walls defining a space therebetween for accommodating the slide plate therein, a cover plate being attached to the base plate by being supported on the side walls to enclose the slide plate, the cover plate defining a plurality of holes corresponding to the slots of the slide plate for entry of the pins of the electronic device into the slots.

9. The electrical connector as claimed in claim 8, wherein each side wall of the base comprises barbs and the cover plate forms two flaps respectively extending downwardly from two sides thereof, and the cover plate defines three openings near each of the flaps, the barbs of each side wall of the base engaging with a corresponding flap of the cover plate at a position just below the openings for securing the cover plate to the base.

10. The electrical connector as claimed in claim 1, wherein the free end of the soldering section of each contact element has a solder ball attached thereto.

11. The electrical connector as claimed in claim 1, wherein the base defines a recess in the bottom face thereof surrounding the free end of the soldering section of each contact element.

12. An electrical connector comprising an insulative body defining a plurality of contact receiving holes in a top face thereof for each receiving a contact element, each contact element comprising a main section and an offset section spaced from and connected to the main section by means of a connection section, the offset section being received and retained in a cavity defined in the insulative body, the cavity being in communication with the contact receiving hole, the main section extending in a vertical direction with a soldering section at a bottom thereof, and the connection section extending in a horizontal direction so as to isolate the offset section to the soldering section.

13. The electrical connector as claimed in claim 12, wherein the offset section comprises barbs engaging with an inside surface of the cavity for securing the contact element in the contact receiving hole.

14. An electrical connector adapted to be mounted to a circuit board having a first thermal expansion coefficient, the electrical connector comprising a housing made of an insulative material having a second thermal expansion coefficient, the housing defining a plurality of holes receiving contact elements therein, each contact element having a main section received and free to move in the corresponding hole and having a free end extending beyond the housing for being soldered to the circuit board, an offset section spaced from and connected to the main section by means of a connecting section, the offset section being secured in a cavity defined in the housing for retaining the contact element in the hole, the connection section being resiliently deformable for accommodating a relative movement between the offset section and the main section caused by a difference between the first and second thermal expansion coefficients.

15. An electrical connector adapted to be mounted on a circuit board for electrically connecting an electronic device to the circuit board, comprising:

a plurality of contact elements;

an insulative base defining a plurality of contact receiving bores for each receiving a corresponding contact element therein;

a slide plate movably supported on the base, the slide plate defining a plurality of slots therein corresponding to the contact receiving bores of the base, each slot being adapted to receive a pin of the electronic device;

driving means coupled to the slide plate for moving the slide plate with respect to the base between a released position and an engaged position for establishing electrical connection between the pin and the contact element;

each contact element comprising a soldering section extending beyond a bottom face of the base to be connected to the circuit board, an engaging section extending into the corresponding slot of the slide plate to be electrically engaged by the pin, and an offset retention section spaced from and connected to the soldering section by a connection section for retaining the contact element in the insulative base.

* * * * *